(12) United States Patent
Giusti et al.

(10) Patent No.: US 10,499,022 B2
(45) Date of Patent: Dec. 3, 2019

(54) RESONANT BIAXIAL MEMS REFLECTOR WITH ELONGATED PIEZOELECTRIC ACTUATORS, AND PROJECTIVE MEMS SYSTEM INCLUDING THE SAME

(71) Applicant: STMicroelectronics S.r.l., Agrate Brianza (MB) (IT)

(72) Inventors: Domenico Giusti, Caponago (IT); Roberto Carminati, Piancogno (IT); Nicolo' Boni, Bergamo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/174,801

(22) Filed: Oct. 30, 2018

(65) Prior Publication Data

US 2019/0068934 A1 Feb. 28, 2019

Related U.S. Application Data

(63) Continuation-in-part of application No. 15/805,705, filed on Nov. 7, 2017, now Pat. No. 10,225,530, (Continued)

(30) Foreign Application Priority Data

Nov. 30, 2015 (IT) .......................... 102015000078398

(51) Int. Cl.
*G02B 26/08* (2006.01)
*H04N 9/31* (2006.01)
(Continued)

(52) U.S. Cl.
CPC ......... *H04N 9/3135* (2013.01); *B81B 3/0045* (2013.01); *G02B 7/1821* (2013.01); (Continued)

(58) Field of Classification Search
CPC ............ G02B 26/0841; G02B 26/0858; G02B 26/101; G02B 7/1821; G02B 26/105; H04N 9/3135; H04N 9/3173; B81B 3/0045
(Continued)

(56) References Cited

U.S. PATENT DOCUMENTS 6,943,484 B2 9/2005 Clark et al.
2005/0094931 A1 5/2005 Yokoyama et al.
(Continued)

OTHER PUBLICATIONS

Hofmann, Ulrich et al., "Wafer Level Vacuum Packaged Two-Axis MEMS Scanning Mirror for Pico Projector Application," MOEMS and Miniaturized Systems XIII, Proc.of SPIE, vol. 8977, 2014 (14 pages).
(Continued)

*Primary Examiner* — Euncha P Cherry
(74) *Attorney, Agent, or Firm* — Crowe & Dunlevy

(57) ABSTRACT

Disclosed herein is a MEMS device including a fixed structure, a mobile structure, and deformable structures extending therebetween. The deformable structures have first ends anchored along X and Y axes of the fixed structure, and have second ends anchored offset from the X and Y axes of the fixed structure. The deformable structures are shaped so as to curve from their anchoring points along the mobile structure back toward the mobile structure, to extend along the perimeter of the mobile structure, and to then curve away from the mobile structure and toward their anchoring points along the fixed structure. Each deformable structure has two piezoelectric elements that extend along the length of that deformable structure, with one piezoelectric element having a greater length than the other piezoelectric element.

25 Claims, 13 Drawing Sheets

Related U.S. Application Data which is a continuation of application No. 15/162,367, filed on May 23, 2016, now Pat. No. 9,843,779.

(51) Int. Cl.
*G02B 7/182* (2006.01)
*G02B 26/10* (2006.01)
*B81B 3/00* (2006.01)

(52) U.S. Cl.
CPC ....... *G02B 26/0858* (2013.01); *G02B 26/101* (2013.01); *H04N 9/3173* (2013.01); *G02B 26/105* (2013.01)

(58) Field of Classification Search
USPC ..................................................... 359/200.8
See application file for complete search history.

(56) References Cited

U.S. PATENT DOCUMENTS

| | | |
|---|---|---|
| 2010/0245966 A1 | 9/2010 | Yasuda |
| 2012/0120470 A1 | 5/2012 | Kitazawa et al. |
| 2013/0094235 A1* | 4/2013 | Sugiyama .......... G02B 26/0858 362/514 |
| 2013/0208330 A1 | 8/2013 | Naono |
| 2013/0328440 A1 | 12/2013 | Kornbluh et al. |
| 2014/0320943 A1 | 10/2014 | Oyama et al. |

OTHER PUBLICATIONS

IT Search Report and Written Opinion for IT 102015000078398 dated Jul. 20, 2016 (10 pages).

\* cited by examiner

RESONANT BIAXIAL MEMS REFLECTOR WITH ELONGATED PIEZOELECTRIC ACTUATORS, AND PROJECTIVE MEMS SYSTEM INCLUDING THE SAME

CROSS REFERENCE TO RELATED APPLICATIONS

This application is a continuation-in-part of U.S. patent application Ser. No. 15/805,705, filed Nov. 7, 2017, which is a continuation of U.S. patent application Ser. No. 15/162,367, filed May 23, 2016 (now U.S. Pat. No. 9,843,779), which claims priority from Italian Application for Patent No. 102015000078398 filed Nov. 30, 2015, the disclosures of which are incorporated by reference.

TECHNICAL FIELD

The present invention relates to a reflector of the MEMS (Micro-Electro-Mechanical Systems) type. In particular, the present invention relates to a resonant biaxial MEMS reflector, which includes piezoelectric actuators. Moreover, the present invention relates to a MEMS projective system including the resonant biaxial MEMS reflector.

BACKGROUND

As is known, numerous MEMS devices are available today. In particular, MEMS reflectors are known, which include mobile elements formed by mirrors.

In general, a MEMS reflector is designed to receive an optical beam and to vary the direction of propagation thereof, via a mirror. Typically, the direction of propagation of the optical beam is varied in a periodic or quasi-periodic way so as to carry out a scan of a portion of space with the reflected optical beam.

In greater detail, MEMS reflectors of a resonant type are moreover known. In general, a resonant MEMS reflector comprises an actuation system that causes oscillation of the respective mirror in a substantially periodic way about a resting position, the period of oscillation being as close as possible to the resonance frequency of the mirror in order to maximize the angular distance covered by the mirror during each oscillation, and hence maximize the size of the portion of space scanned.

Among resonant MEMS reflectors, biaxial MEMS reflectors are moreover known, where the mirror oscillates about two different axes, perpendicular to one another, with frequencies approximately equal to the respective resonance frequencies of the mirror with respect to the aforesaid axes.

In the context of the generation of images using resonant biaxial MEMS reflectors, it is known to adopt markedly different resonance frequencies for the two scanning axes. For example, resonant biaxial MEMS reflectors are known having their two resonance frequencies equal, for example, to 18 kHz and 600 Hz. Moreover, irrespective of the specific values of the resonance frequencies, when an image is formed using a resonant biaxial MEMS reflector, the latter directs the reflected optical beam in such a way that it follows a Lissajous trajectory. Consequently, the full image is obtained as set of interlaced complementary images.

This having been said, the use of resonant biaxial MEMS reflectors entails the generation of images affected by flicker. To overcome this drawback, the image-refresh rate may be increased up to values much higher than sixty frames per second. Since, according to another point of view, the flicker phenomenon can be interpreted as an imperfect coverage of each frame, the increase in the refresh rate renders this phenomenon less perceptible to the human eye.

In order to reduce the flicker phenomenon, the paper by Hofmann et al., "Wafer level vacuum packaged two-axis MEMS scanning mirror for pico projector application", Proceedings of SPIE, Vol. 8977 89770A-11 (incorporated by reference), suggests adoption of a biaxial structure with high resonance frequencies, which differ by 60 Hz. In practice, the aforementioned paper proposes a resonant biaxial MEMS reflector with an actuation system of an electrostatic type, where both of the resonance frequencies are relatively high (one is 14.9 kHz and the other is 15.6 kHz), the difference between them being 700 Hz. This enables reduction of the refresh rate to values of less than sixty frames per second, without the flicker phenomenon excessively damaging the quality of the images. However, unfortunately there are not known solutions that enable precise control of the difference between the two resonance frequencies, even for particularly low values of this difference and in the case of operating bands that reach high frequencies (for example, between 20 kHz and 30 kHz). In this connection, it should be noted how in theory the adoption of high resonance frequencies close to one another enables, given the same refresh rate, a higher resolution to be obtained, as well as a better coverage of the images.

There is a need in the art to provide a MEMS device that will solve at least in part the drawbacks of the known art.

SUMMARY

Disclosed herein is a MEMS device including a fixed structure having first, second, third, and fourth anchoring points. A mobile structure is surrounded by the fixed structure and has first, second, third, and fourth connection points. The second and fourth anchoring points are offset with respect to a first axis of the mobile structure and are across a second axis of the mobile structure from one another. The first and third anchoring points are offset with respect to the second axis and are across the first axis from one another. The first and third connection points are aligned with the first axis and are across the second axis from one another. The second and fourth connection points are aligned with the second axis and are across the first axis from one another. A first deformable structure connects the first anchoring point to the first connection point. The first deformable structure includes a first curved portion connected to the first connection point, a first intermediate elongated portion having a proximal end coupled connected to the first curved portion, and a second curved portion connecting a distal end of the first intermediate elongated portion to the first anchoring point. A second deformable structure connects the second anchoring point to the second connection point, the second deformable structure including a third curved portion connected to the second connection point, a second intermediate elongated portion having a proximal end coupled connected to the third curved portion, and a fourth curved portion connecting to a distal end of the second intermediate elongated portion to the second anchoring point. A third deformable structure connects the third anchoring point to the third connection point, the third deformable structure including a fifth curved portion connected to the third connection point, a third intermediate elongated portion having a proximal end coupled connected to the fifth curved portion, and a sixth curved portion connecting a distal end of the third intermediate elongated portion to the third anchoring point. A fourth deformable structure connects the fourth anchoring point to the fourth connection point, the fourth deformable structure including a seventh curved portion connected to the fourth connection point, a fourth intermediate elongated portion having a proximal end coupled connected to the seventh curved portion, and an eighth curved portion connecting a distal end of the fourth intermediate elongated portion to the fourth anchoring point. The first deformable structure includes first and second piezoelectric elements and no other piezoelectric elements. The second deformable structure includes third and fourth piezoelectric elements and no other piezoelectric elements. The third deformable structure includes fifth and sixth piezoelectric elements and no other piezoelectric elements. The fourth deformable structure includes seventh and eighth piezoelectric elements and no other piezoelectric elements.

BRIEF DESCRIPTION OF THE DRAWINGS

For a better understanding, embodiments are now described, purely by way of non-limiting example and with reference to the attached drawings, wherein.

DETAILED DESCRIPTION

Figure 1:
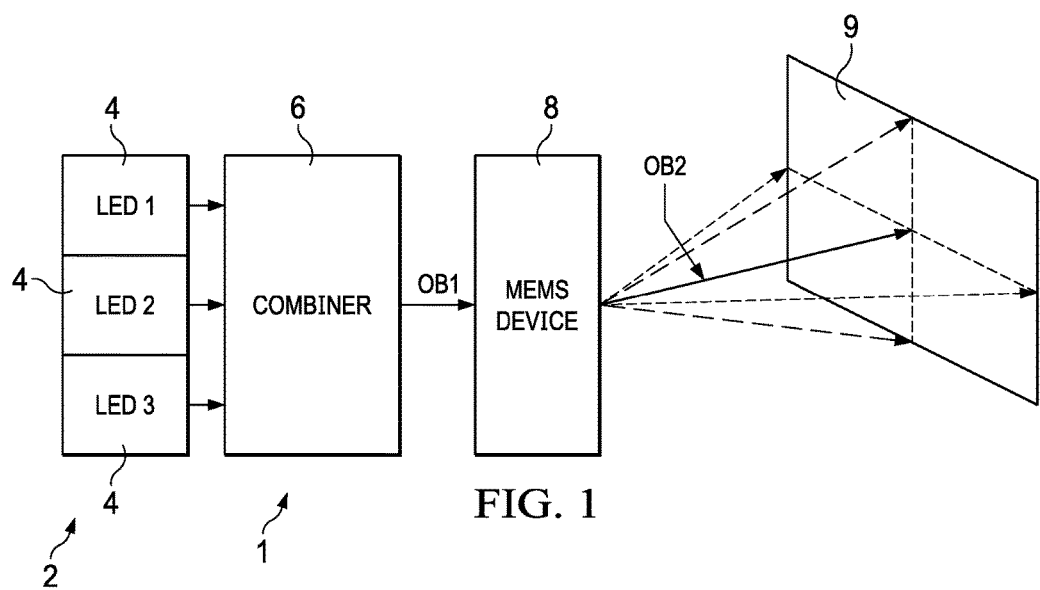
FIG. 1 shows a block diagram of a projective system including a MEMS reflector.

FIG. 1 shows a MEMS projective system 1, which includes a light source 2 formed by a plurality of LEDs 4, each of which emits electromagnetic radiation at a corresponding wavelength. For example, FIG. 1 shows three LEDs 4, which emit radiation, respectively, around the red (620-750 nm) wavelength, the green (495-570 nm) wavelength, and the blue (450-475 nm) wavelength.

The MEMS projective system 1 further comprises an optical combiner 6 and a MEMS reflector 8. Moreover, FIG. 1 shows also a screen 9. The MEMS projective system 1 forms a pico-projector.

The optical combiner 6 is arranged downstream of the light source 2 so as to receive the electromagnetic radiation emitted by the LEDs 4 and form a single optical beam OB1, obtained from the combination of said electromagnetic radiation. For this purpose, the optical combiner 6 may, for example, include one or more dichroic elements. Moreover, the optical combiner 6 is designed to direct the optical beam OB1 onto the MEMS reflector 8. In turn, the MEMS reflector 8, described in greater detail hereinafter, is designed to reflect the optical beam OB1, thus generating a reflected optical beam OB2, and to send the reflected optical beam OB2 onto the screen 9 for bringing about formation of images on the screen 9.

In detail, the MEMS reflector 8 is designed to vary in time the orientation in space of the axis of the reflected optical beam OB2 so as to scan in a substantially periodic way portions of the screen 9. As described in greater detail hereinafter, the MEMS reflector 8 is of a biaxial type, with axes orthogonal to one another.

Figure 2:
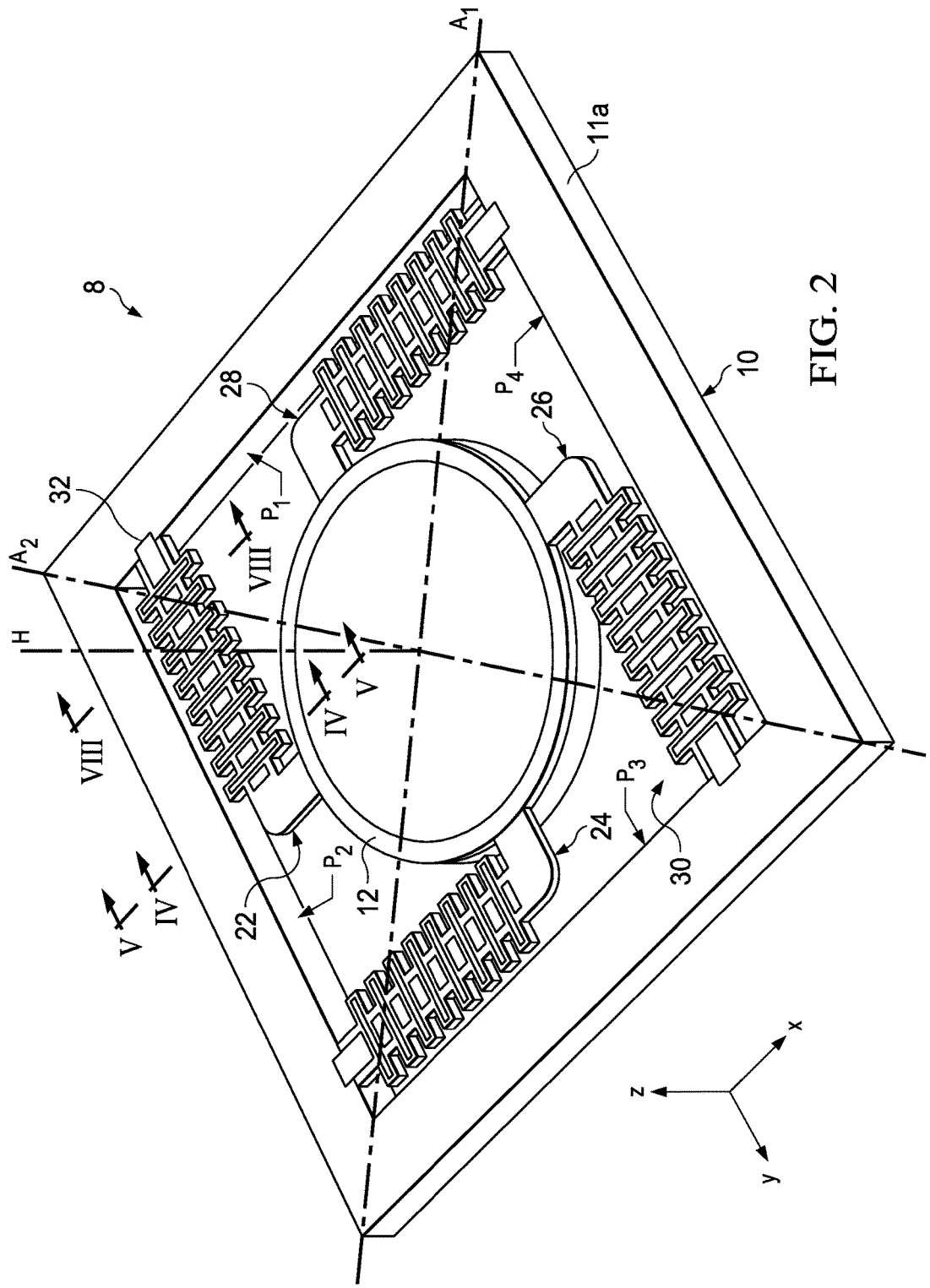
FIG. 2 is a schematic perspective view with portions of the MEMS reflector removed.

As shown in FIG. 2, the MEMS reflector 8 comprises a structure 10, which will be referred to in what follows as the fixed structure 10, as well as a mobile structure 12, and four structures, which will be referred to in what follows as the first connection structure 22, the second connection structure 24, the third connection structure 26, and the fourth connection structure 28.

In greater detail, the fixed structure 10 comprises a respective bottom portion 11a. The bottom portion 11a of the fixed structure 10 has the shape of a parallelepiped with square base, extending inside which is a cavity 30 of a through type, which to a first approximation also has the shape of a parallelepiped with square base. The cavity 30 is then delimited laterally by a first side wall $P_1$, a second side wall $P_2$, a third side wall $P_3$, and a fourth side wall $P_4$. Moreover, the first and third side walls $P_1$, $P_3$ are opposite to one another and are parallel to an axis x of an orthogonal reference system xyz, whereas the second and fourth side walls $P_2$, $P_4$ are opposite to one another and parallel to the axis y of the reference system xyz.

Without any loss of generality, the first, second, third, and fourth connection structures 22, 24, 26, 28 are the same as one another. For this reason, in what follows, the description is limited to the first connection structure 22, it being understood that the second, third, and fourth connection structures 24, 26, 28 are the same as the first connection structure 22, except where otherwise specified.

Figure 3:
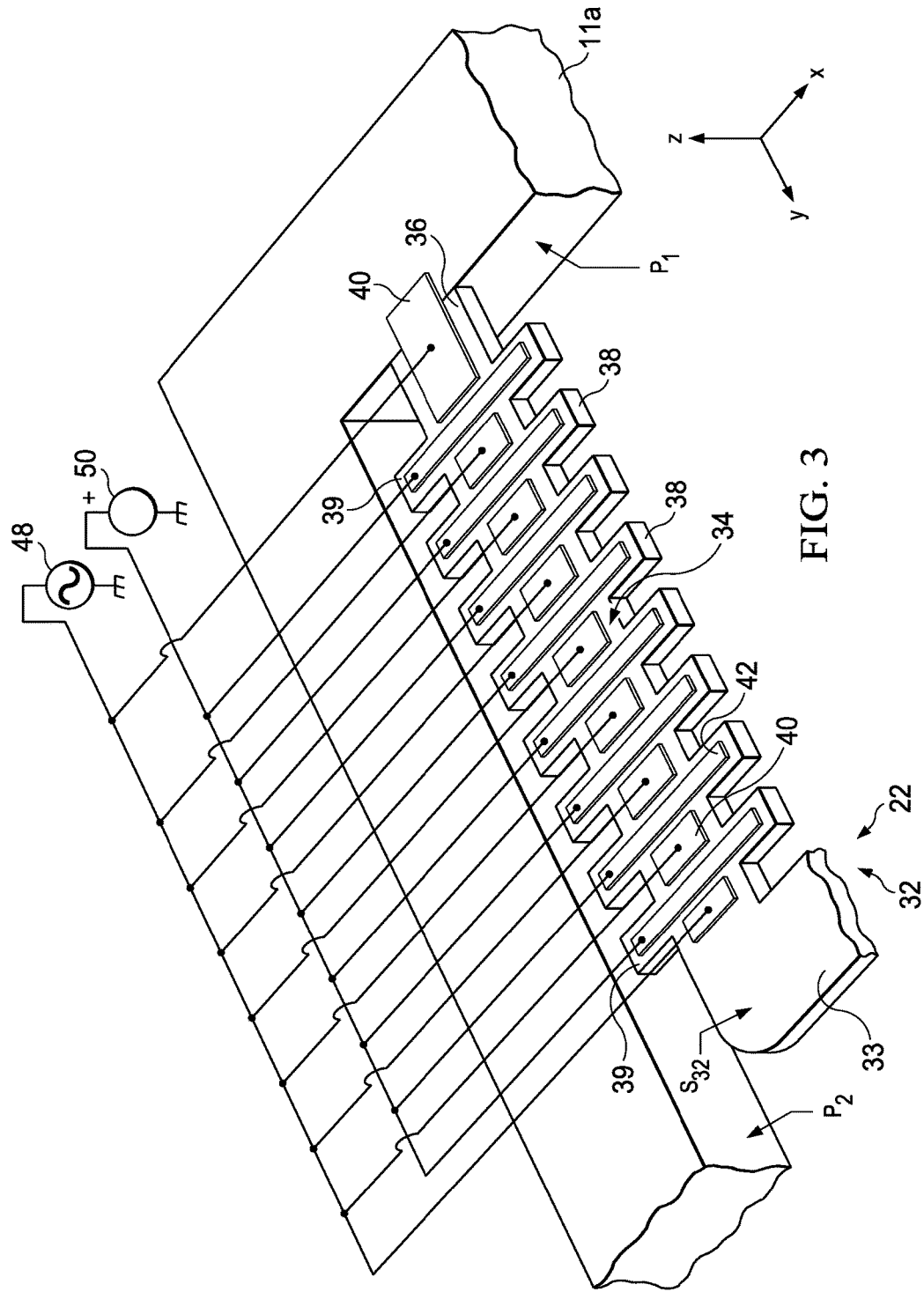
FIG. 3 shows an enlargement of a portion of FIG. 2.

The first connection structure 22 is elastically deformable. In addition, as shown in FIG. 3, the first connection structure 22 comprises a supporting structure 32, which is described hereinafter, on the hypothesis that the first connection structure 22 is in resting conditions, except where otherwise specified.

In detail, the supporting structure 32 extends in the cavity 30 and comprises a first portion 33 and a second portion 34.

In greater detail, the first portion 33 of the supporting structure 32 has an elongated shape parallel to the axis x. The second portion 34 of the supporting structure 32 forms a main body 36, a plurality of transverse elements of a first type, designated by 38, and a plurality of transverse elements of a second type, designated by 39. The main body 36 has an elongated shape and extends parallel to the axis y. Moreover, the main body 36 is connected to the first portion 33 of the supporting structure 32 so as to form approximately an L shape. More in particular, the first portion 33 of the supporting structure 32 and the main body 36 of the second portion 34 of the supporting structure 32 form, respectively, the short arm and the long arm of the L shape defined by the supporting structure 32. In addition, a first end of the supporting structure 32, defined by the first portion 33, is fixed to the mobile structure 12, and a second end of the supporting structure 32, defined by the main body 36, is fixed to the first side wall $P_1$.

The inner transverse elements 38 of the first type and the outer transverse elements 39 of the second type have an elongated shape directed parallel to the axis x. In other words, the transverse elements are elongated in a direction perpendicular to the direction of extension of the main body 36.

If the inner transverse elements 38 of the first type and the outer transverse elements 39 of the second type are referred to, respectively, as the inner transverse elements 38 and outer transverse elements 39, to each inner transverse element 38 there corresponds a respective outer transverse element 39. Furthermore, the outer transverse elements 39 extend from the main body 36 toward the bottom portion 11a of the fixed structure 10, and in particular toward the second side wall $P_2$; the inner transverse elements 38 extend from the main body 36 toward the mobile structure 12, i.e., toward the fourth side wall $P_4$. More in particular, each inner transverse element 38 is aligned (parallel to the axis x) to the corresponding outer transverse element 39. These transverse elements extend on opposite sides with respect to the main body 36. Purely by way of example, in the embodiment shown in FIG. 3, eight pairs of transverse elements are present.

The first and second portions 33, 34 of the supporting structure 32 are delimited at the top by a top surface $S_{32}$. The top surface $S_{32}$ hence delimits the main body 36, the inner transverse elements 38, and the outer transverse elements 39.

The first connection structure 22 further comprises a plurality of piezoelectric regions 40, which will be referred to in what follows as the main piezoelectric regions 40.

In detail, the main piezoelectric regions 40 are made, for example, of lead zirconate titanate (PZT) and extend on the top surface $S_{32}$. In particular, the main piezoelectric regions 40 are arranged in succession in a direction parallel to the axis y, in contact with the main body 36; i.e., they are arranged one after another in the longitudinal direction of the main body 36, at a distance from one another.

In greater detail, and without any loss of generality, each main piezoelectric region 40 may have, for example, the shape of a parallelepiped with a height (measured along the axis z) smaller than the length and the width, either the length or the width being parallel to the axis x.

The first connection structure 22 further comprises a plurality of additional piezoelectric regions 42, which will be referred to in what follows as the secondary piezoelectric regions 42.

The secondary piezoelectric regions 42 are made, for example, of lead zirconate titanate. In addition, without any loss of generality, each secondary piezoelectric region 42 has an elongated shape, in a direction parallel to the axis x. For example, each secondary piezoelectric region 42 may have the shape of a parallelepiped with a height smaller than the length (parallel to the axis x) and than the width.

In greater detail, the secondary piezoelectric regions 42 extend on the top surface $S_{32}$. In particular, the secondary piezoelectric regions 42 are arranged in succession in a direction parallel to the axis y, in contact with the main body 36. More in particular, each secondary piezoelectric region 42 extends in contact with a corresponding pair formed by an inner transverse element 38 and by the corresponding outer transverse element 39, as well as in contact with the portion of the main body 36 from which this inner transverse element 38 and this corresponding outer transverse element 39 extend. Each secondary piezoelectric region 42 hence has an elongated shape in a direction parallel to the axis x.

Once again with reference to the main piezoelectric regions 40, each extends on a corresponding portion of the main body 36. Moreover, the portions of main body 36 on which corresponding main piezoelectric regions 40 extend are interspersed with the portions of main body 36 on which the secondary piezoelectric regions 42 extend. Consequently, in a direction parallel to the axis y, the main piezoelectric regions 40 and the secondary piezoelectric regions 42 are interspersed with one another.

For reasons described hereinafter, in use the main piezoelectric regions 40 are electrically connected to a first a.c. generator 48, which is designed to generate an a.c. voltage. In particular, the main piezoelectric regions 40 are connected to one and the same first terminal of the first a.c. generator 48, the second terminal of which is set, for example, to ground. The secondary piezoelectric regions 42 are, instead, electrically connected to one and the same first terminal of a first d.c. generator 50, the second terminal of which is connected, for example, to ground. The first d.c. generator 50 is designed to generate a d.c. voltage, which can be varied in a controlled way. In FIG. 3, the electrical connections between the main/secondary piezoelectric regions 40/42 and the first a.c./d.c. generator 48/50 are represented qualitatively.

Once again with reference to the aforementioned bottom portion 11a of the fixed structure 10, it comprises a semiconductor region 60 (shown in FIG. 4), which is made, for example, of silicon and which will be referred to in what follows as the fixed semiconductor region 60.

The bottom portion 11a of the fixed structure 10 further comprises a conductive region 62 and a first insulating region 64 and a second insulating region 66, which will be referred to in what follows, respectively, as the fixed conductive region 62 and the first and second fixed insulating regions 64, 66.

The first fixed insulating region 64 is made, for example, of thermal oxide and extends over the fixed semiconductor region 60, with which it is in direct contact. The fixed conductive region 62 is made, for example, of polysilicon and extends over the first fixed insulating region 64, with which it is in direct contact. The second fixed insulating region 66 is made, for example, of TEOS oxide and extends over the fixed conductive region 62, with which it is in direct contact.

The bottom portion 11a of the fixed structure 10 further comprises an electrode region 68, which will be referred to in what follows as the fixed electrode region 68. In detail, the fixed electrode region 68 is made, for example, of a metal (for example, ruthenium) and extends over the second fixed insulating region 66, with which it is in direct contact.

The supporting structure 32 of the first connection structure 22 comprises a respective semiconductor region 70, which is made, for example, of silicon and which will be referred to in what follows as the deformable semiconductor region 70.

In resting conditions, the deformable semiconductor region 70 is delimited at the top by a surface $S_{70}$ of a planar type, which will be referred to in what follows as the first intermediate surface $S_{70}$. Moreover, if the surface that delimits at the top the fixed semiconductor region 60 is referred to as the second intermediate surface $S_{60}$, in resting conditions the first intermediate surface $S_{70}$ is coplanar with the second intermediate surface $S_{60}$. Moreover, the deformable semiconductor region 70 has a smaller thickness than the fixed semiconductor region 60 and delimits a portion of the cavity 30 at the top.

The supporting structure 32 of the first connection structure 22 further comprises a respective conductive region 72, a respective first insulating region 74, and a respective second insulating region 76, which will be referred to in what follows, respectively, as the deformable conductive region 72 and the first and second deformable insulating regions 74, 76.

The first deformable insulating region 74 is made, for example, of thermal oxide and extends over the deformable semiconductor region 70, with which it is in direct contact. Without any loss of generality, the first deformable insulating region 74 has the same thickness as the first fixed insulating region 64.

The deformable conductive region 72 is made, for example, of polysilicon and extends over the first deformable insulating region 74, with which it is in direct contact. Without any loss of generality, the deformable conductive region 72 has the same thickness as the fixed conductive region 62.

The second deformable insulating region 76 is made, for example, of TEOS oxide and extends over the deformable conductive region 72, with which it is in direct contact. Without any loss of generality, the second deformable insulating region 76 has the same thickness as the second fixed insulating region 66.

The supporting structure 32 of the first connection structure 22 further comprises a respective electrode region 78, which will be referred to in what follows as the bottom electrode region 78. In detail, the bottom electrode region 78 is made, for example, of platinum and extends over the second deformable insulating region 76, with which it is in direct contact.

The bottom electrode region 78 is delimited at the top by the aforementioned top surface $S_{32}$. Without any loss of generality, the bottom electrode region 78 has the same thickness as the fixed electrode region 68. Moreover, the bottom electrode region 78 and the fixed electrode region 68 form a single region, i.e., form a single piece; in use, said region can be set to ground, as described hereinafter.

Figure 4:
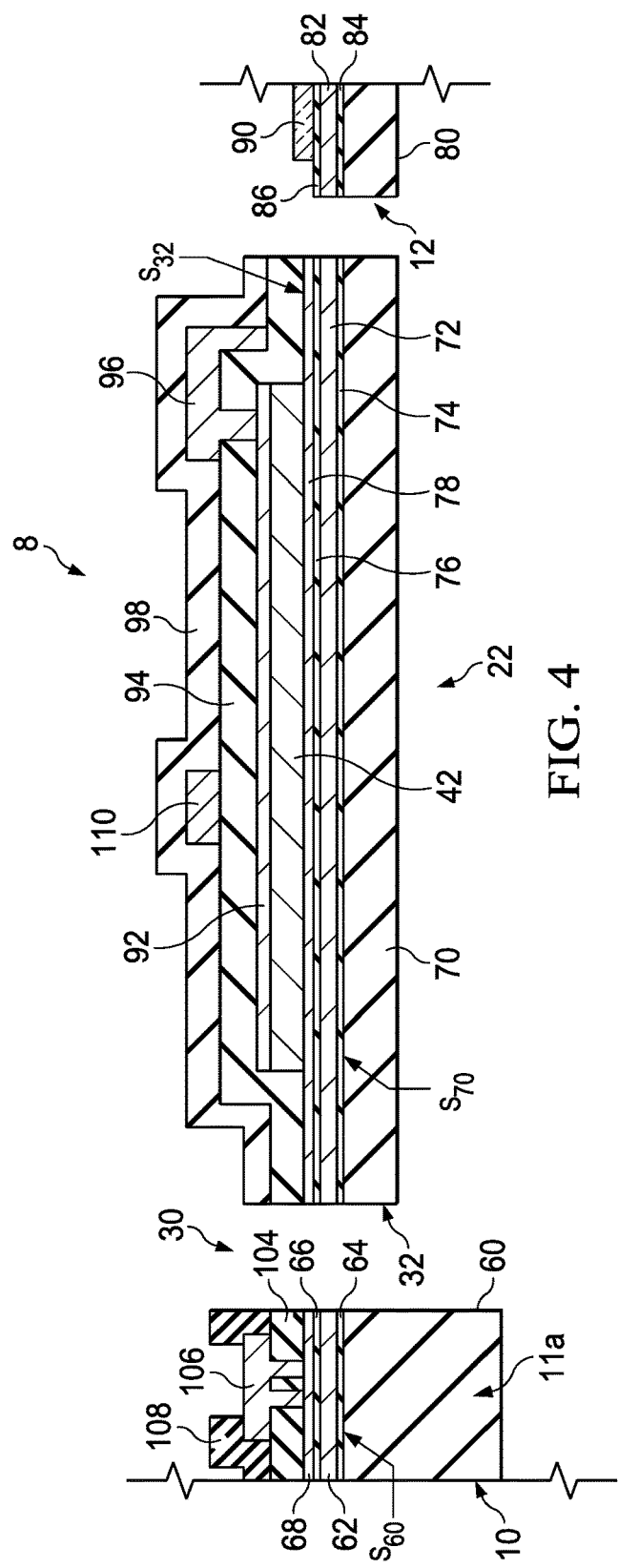
FIGS. 4 and 5 are schematic cross-sectional views (not in scale) of the MEMS reflector, taken respectively along lines of section IV-IV and V-V shown in FIG. 2.

In practice, the main piezoelectric regions 40 and the secondary piezoelectric regions 42 extend over the bottom electrode region 78, with which they are in direct contact. In this connection, purely by way of example, the cross section shown in FIG. 4 is represented so as to show a secondary piezoelectric region 42. Without any loss of generality, in the embodiment shown in FIG. 4, each one of the main piezoelectric regions 40 and the secondary piezoelectric regions 42 extends parallel to the axis x for an extension smaller than the corresponding extension of the underlying portion of bottom electrode region 78, thus leaving a part of the latter exposed.

Extending over each main piezoelectric region 40 and each secondary piezoelectric region 42, in direct contact therewith, is a corresponding metal region 92, made, for example, of an alloy of metal materials. Without any loss of generality, in the embodiment illustrated in FIG. 4, each main piezoelectric region 40 and each secondary piezoelectric region 42 are entirely coated by the corresponding metal regions 92.

The first connection structure 22 further comprises a dielectric region 94, which will be referred to in what follows as the deformable dielectric region 94.

In detail, the deformable dielectric region 94 is made, for example, of silicon oxide, or else silicon nitride, and extends, in direct contact therewith, over the metal regions 92 and the exposed portions of the bottom electrode region 78.

The first connection structure 22 further comprises a first metallization 96, which in part extends on the deformable dielectric region 94 and in part traverses the deformable dielectric region 94 itself, until it comes into contact with the secondary piezoelectric regions 42. The first metallization 96 hence enables electrical connection of the secondary piezoelectric regions 42 to the first d.c. generator 50.

The first connection structure 22 further comprises a second metallization 110, which will be described in detail hereinafter and is arranged on the deformable dielectric region 94. Moreover, the first connection structure 22 comprises a further dielectric region 98, which will be referred to in what follows as the deformable passivation region 98.

In detail, the deformable passivation region 98 is made, for example, of silicon nitride and extends on the deformable dielectric region 94 and the first and second metallizations 96, 110.

Without any loss of generality, it is possible, as shown in FIG. 4, for the fixed structure 10 to comprise moreover a respective dielectric region 104, which will be referred to in what follows as the fixed dielectric region 104. The fixed dielectric region 104 may be made of the same material of which the deformable dielectric region 94 is made and extends on the fixed electrode region 68. In addition, the fixed dielectric region 104 and the deformable dielectric region 94 may form a single overall region; i.e., they may not be physically separate.

The fixed structure 10 further comprises a third metallization 106, which extends through the fixed dielectric region 104, as far as into contact with the fixed electrode region 68. In use, as mentioned previously, the third metallization 106 makes it possible to set to ground the fixed electrode region 68 and the bottom electrode region 78.

In the embodiment shown in FIG. 4, the fixed structure 10 comprises a further dielectric region 108, which will be referred to in what follows as the fixed passivation region 108. The fixed passivation region 108 extends on the fixed dielectric region 104 and the third metallization 106, leaving a portion of the third metallization 106 exposed. The fixed passivation region 108 and the deformable passivation region 98 may form a single region.

Figure 5:
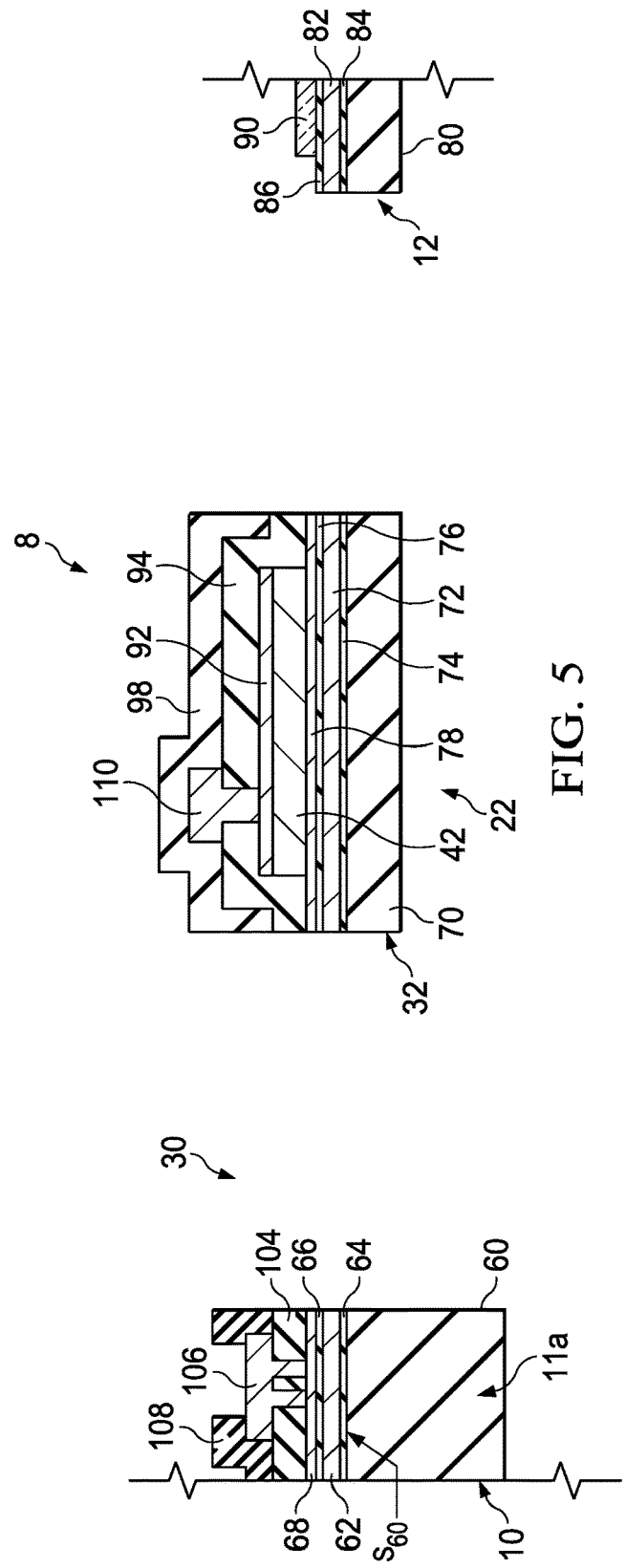

Once again with reference to the second metallization 110, as shown in FIG. 5, in part it extends on the deformable dielectric region 94 and in part it traverses the deformable dielectric region 94 itself until it comes into contact with the main piezoelectric regions 40. The second metallization 110 hence enables electrical connection of the main piezoelectric regions 40 to the first a.c. generator 48.

The mobile structure 12, as shown in FIG. 4, further comprises a respective semiconductor region 80, a respective conductive region 82, a respective first insulating region 84, and a respective second insulating region 86, which will be referred to in what follows, respectively, as the mobile semiconductor region 80, the mobile conductive region 82 and the first and second mobile insulating regions 84, 86.

The mobile semiconductor region 80, the first mobile insulating region 84, the mobile conductive region 82, and the second mobile insulating region 86 are arranged in succession, stacked on top of one another. Moreover, the mobile semiconductor region 80, the first mobile insulating region 84, the mobile conductive region 82, and the second mobile insulating region 86 may have the same thicknesses as the deformable semiconductor region 70, the first deformable insulating region 74, the deformable conductive region 72, and the second deformable insulating region 76, respectively.

The mobile semiconductor region 80, the fixed semiconductor region 60, and the deformable semiconductor region 70 may form a single semiconductor region.

The first fixed insulating region 64, the first deformable insulating region 74, and the first mobile insulating region 84 may form a single insulating region. Likewise, the second fixed insulating region 66, the second deformable insulating region 76, and the second mobile insulating region 86 may form a single insulating region.

In addition, the fixed conductive region 62, the deformable conductive region 72, and the mobile conductive region 82 may form a single conductive region.

Present on the second mobile insulating region 86 is a mirror 90, which is arranged in direct contact with the second mobile insulating region 86 and is made, for example, of a metal film (for example, an aluminum film).

The second, third, and fourth connection structures 24, 26, 28 are fixed to the second, third, and fourth side walls $P_2$, $P_3$, $P_4$, respectively. In addition, in top plan view, the second connection structure 24 is rotated through 90° in a counterclockwise direction with respect to the first connection structure 22 in such a way that its own main body is oriented parallel to the axis x. The third connection structure 26 is rotated through 180° in a counterclockwise direction with respect to the first connection structure 22 in such a way that its own main body is oriented parallel to the axis y. Finally, the fourth connection structure 28 is rotated through 270° in a counterclockwise direction with respect to the first connection structure 22 in such a way that its own main body is oriented parallel to the axis x. Again, the points of fixing of the first, second, third, and fourth connection structures 22, 24, 26, 28 to the mobile structure 12 are arranged substantially at the same distance from an axis of symmetry H of the mobile structure 12 (in resting conditions). These fixing points are moreover spaced at equal angles apart from one another in such a way that adjacent fixing points are angularly spaced apart by 90°.

Figure 6:
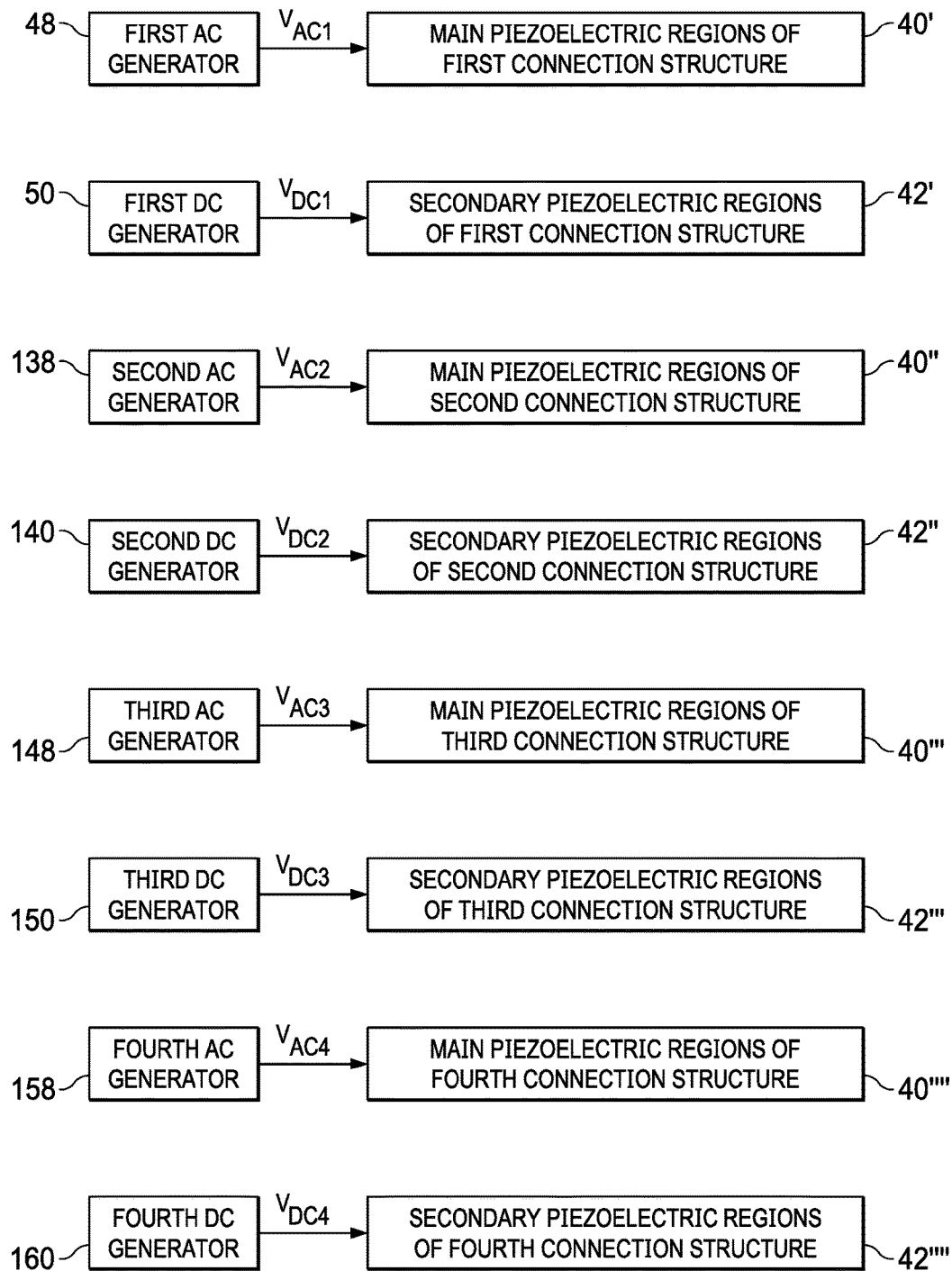
FIG. 6 shows a block diagram that illustrates electrical connections between portions of a MEMS system that includes the MEMS reflector.

As shown in FIG. 6, the MEMS projective system 1 further comprises a second a.c. generator 138, a third a.c. generator 148, and a fourth a.c. generator 158, as well as a second d.c. generator 140, a third d.c. generator 150, and a fourth d.c. generator 160. In FIG. 6, the a.c. voltages generated by the first, second, third, and fourth a.c. generators 48, 138, 148, and 158 are designated, respectively, by $V_{AC1}$, $V_{AC2}$, $V_{AC3}$, and $V_{AC4}$, whereas the d.c. voltages generated by the first, second, third, and fourth d.c. generators 50, 140, 150, and 160 are designated, respectively, by $V_{DC1}$, $V_{DC2}$, $V_{DC3}$, and $V_{DC4}$. Moreover, FIG. 6 shows how the first a.c. generator 48 and the first d.c. generator 50 apply, respectively, the aforementioned voltages $V_{AC1}$ and $V_{DC1}$ to the main piezoelectric regions (here designated by 40') and to the secondary piezoelectric regions (here designated by 42') of the first connection structure 22. The second, third, and fourth a.c. generators 138, 148, 158 apply the aforementioned voltages $V_{AC2}$, $V_{AC3}$, and $V_{AC4}$, respectively, to the main piezoelectric regions (designated, respectively, by 40", 40''', and 40'''') of the second, third, and fourth connection structures 24, 26, 28. The second, third, and fourth d.c. generators 140, 150, 160 apply, respectively, the aforementioned voltages $V_{DC2}$, $V_{DC3}$, and $V_{DC4}$ to the secondary piezoelectric regions (designated, respectively, by 42", 42''', and 42'''') of the second, third, and fourth connection structures 24, 26, 28.

In greater detail, the voltages $V_{AC1}$ and $V_{AC3}$ have one and the same amplitude (for example, approximately 30 V), one and the same frequency $f_1$, and are in phase opposition; i.e., they are phase shifted by 180° with respect to one another. The voltages $V_{AC2}$ and $V_{AC4}$ have a same amplitude, a same frequency $f_2$, and are in phase opposition; i.e., they are phase shifted by 180° with respect to one another.

This being said, the first and third connection structures 22, 26 form a first actuation unit such that, following upon application of the aforementioned voltages $V_{AC1}$ and $V_{AC3}$, this first actuation unit causes an oscillation (about the resting position and with a frequency equal to the aforementioned frequency $f_1$) of the mobile structure 12, about an axis $A_1$, which is inclined by 45° with respect to the axis x and passes, for example, through the centroid of the mobile structure 12. In practice, this oscillation is due to the periodic deformations undergone by the first and third connection structures 22, 26 on account of application of the aforementioned voltages $V_{AC1}$ and $V_{AC3}$.

Figure 7A:
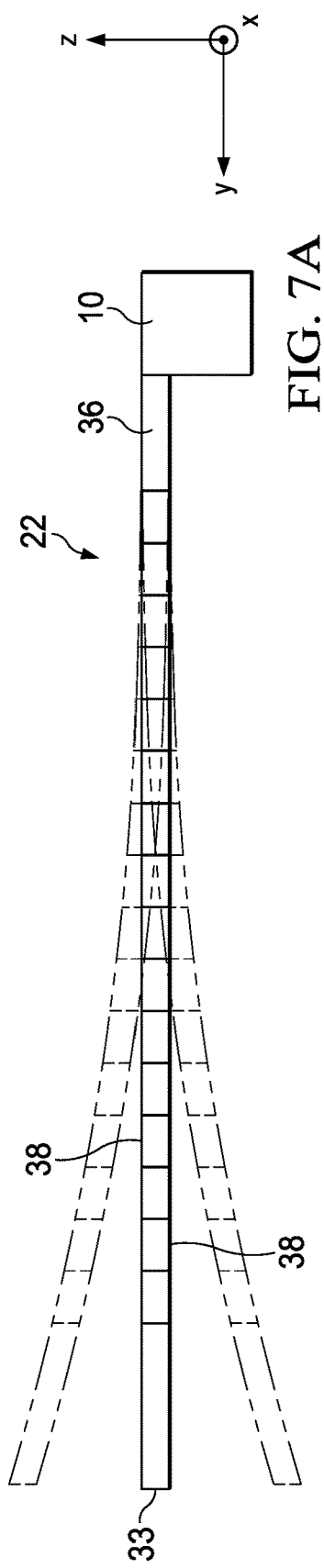
FIG. 7A is a schematic side view of a portion of the MEMS reflector, when subjected to an oscillation.

In greater detail, considering, for example, when the main piezoelectric regions 40 of the first connection structure 22 are subjected to a voltage that is, for example, positive, they undergo, amongst other things, lengthening in directions parallel to the axes x and y. In other words, there occurs a differential lengthening of each main piezoelectric region 40 with respect to the underlying supporting structure 32, what entails, in a way similar to what occurs in the case of bimetallic strips, bending of the first connection structure 22, with consequent curving of the latter. In particular, the first connection structure 22 bends in such a way that the first portion 33 of the supporting structure 32, fixed to the mobile structure 12, lowers, drawing along with it the part of mobile structure 12 to which it is fixed. Instead, in the case where to the main piezoelectric regions 40 a voltage that is, for example, negative is applied, the deflection of the first connection structure 22 is such that the first portion 33 of the supporting structure 32 rises. In either case, to a first approximation, the deflection of the first connection structure 22 occurs in a plane parallel to the plane yz, as shown qualitatively in FIG. 7A, where for simplicity possible torsions about the longitudinal axis of the main body 36 are not represented. The hypothetical deformations of the first connection structure 22 shown in FIG. 7A are hence purely qualitative, to provide an explanatory example.

This being said, since the main piezoelectric regions 40 of the first and third connection structures 22, 26 are driven in phase opposition, corresponding to a rise of the first portion 33 of the supporting structure 32 of the first connection structure 22 is a lowering of the corresponding portion of the third connection structure 26, with consequent rotation of the mobile structure 12.

Figure 7B:
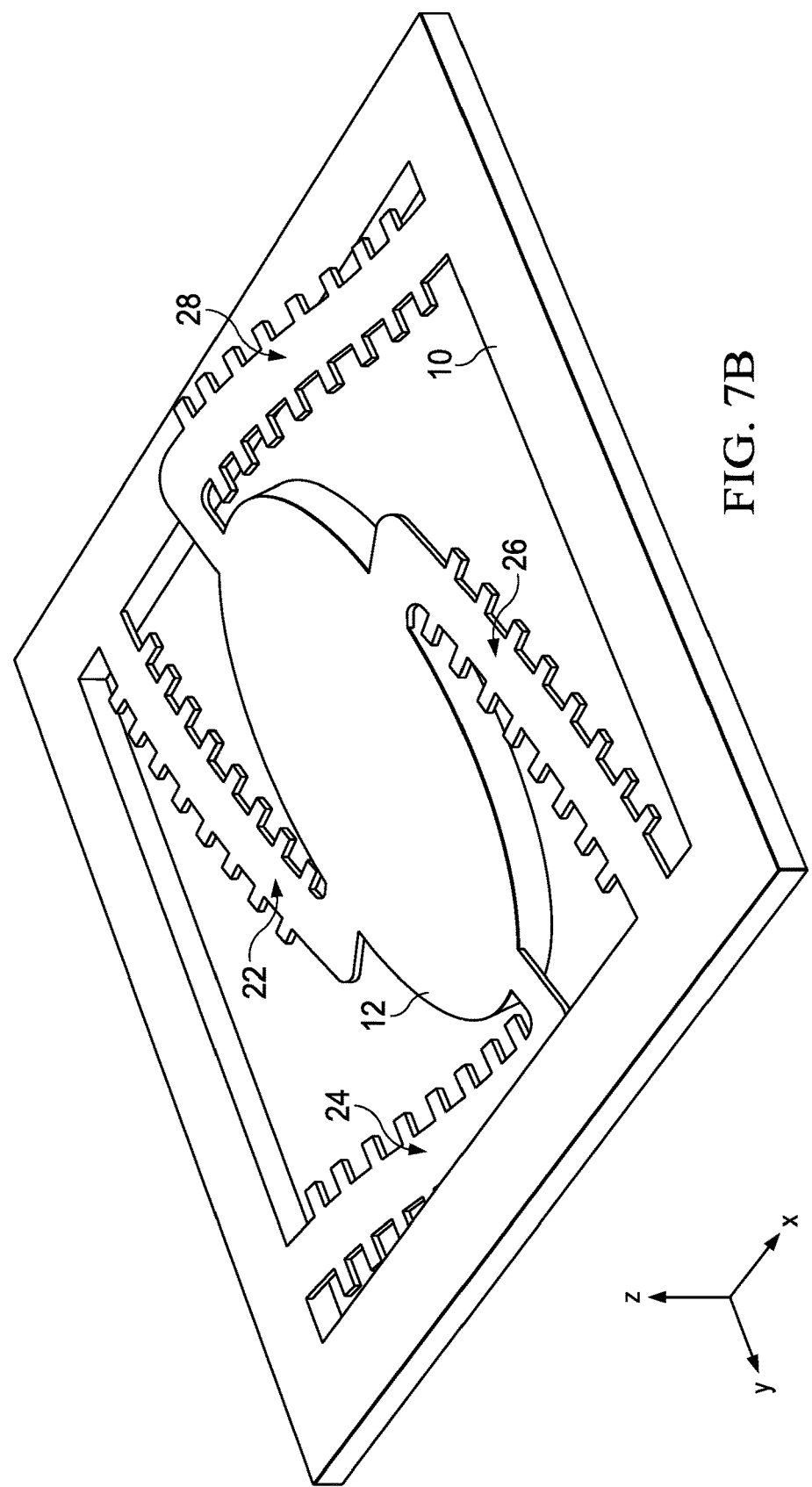
FIG. 7B is a schematic perspective view with portions of the MEMS reflector removed, when subjected to an example of deformation.

For the same reasons, the second and fourth connection structures 24, 28 form a second actuation unit such that, following upon application of the aforementioned voltages $V_{AC2}$ and $V_{AC4}$, this second actuation unit causes an oscillation (about the resting position and with a frequency equal to the aforementioned frequency $f_2$) of the mobile structure 12, about an axis $A_2$ inclined by 45° with respect to the axes x and y and orthogonal to the axis $A_1$. An example of possible deformation to which the MEMS reflector 8 is subjected is shown qualitatively in FIG. 7B.

In greater detail, the aforementioned frequencies $f_1$ and $f_2$ are approximately equal to the resonance frequencies of the mobile structure 12, respectively about the aforementioned axes $A_1$ and $A_2$, in order to convert electrical energy into kinetic energy in an efficient way. In other words, if $f_{r1}$ and $f_{r2}$ are the resonance frequencies of the mobile structure 12 about the aforementioned axes $A_1$ and $A_2$, respectively, we have $f_1 \approx f_{r1}$ and $f_2 \approx f_{r2}$.

In greater detail, the resonance frequencies $f_{r1}$ and $f_{r2}$ depend upon the voltages $V_{DC1}$, $V_{DC2}$, $V_{DC3}$, and $V_{DC4}$. In what follows it is assumed, without any loss of generality, that $V_{DC1}=V_{DC3}=V_{axis1}$ and $V_{DC2}=V_{DC4}=V_{axis2}$.

Once again in greater detail, the MEMS reflector 8 is such that, if $V_{DC1}=V_{DC2}=V_{DC3}=V_{DC4}$, $f_{r1}=f_{r2}$, since the MEMS reflector 8 exhibits a symmetry about the axis of symmetry H. This being said, the resonance frequency $f_{r1}$ can be modulated by varying the voltage $V_{axis1}$, whereas the resonance frequency $f_{r2}$ can be modulated by varying the voltage $V_{axis2}$.

In practice, the first, second, third, and fourth connection structures 22, 24, 26, and 28 function as springs. The voltage $V_{axis1}$ modulates the stiffness of the first and third connection structures 22, 26, whereas the voltage $V_{axis2}$ modulates the stiffness of the second and fourth connection structures 24, 28. In particular, with reference, for example, to the first connection structure 22, the voltage $V_{axis1}$ modulates the stiffness of the first connection structure 22 with regard to deformations in the plane yz, i.e., to deformations that cause oscillation of the mobile structure 12 about the axis $A_1$.

Figure 8:
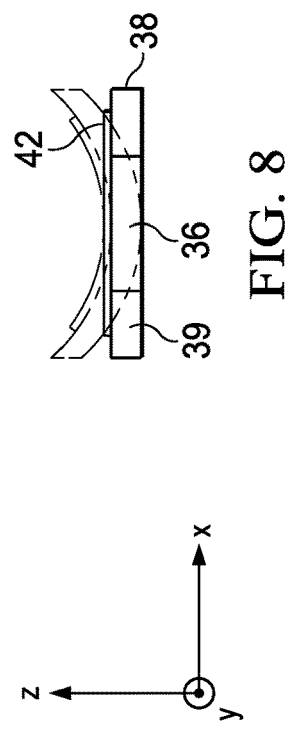
FIG. 8 is a schematic cross-sectional view (not in scale) of a portion of the MEMS reflector, when subjected to bending, this section being taken along the line of section VIII-VIII shown in FIG. 2.

In greater detail, with reference, for example, to the first connection structure 22, in the case where, $V_{axis1}>0$, there occurs (amongst other things) a differential lengthening of each secondary piezoelectric region 42, parallel to the axis x, with respect to the underlying supporting structure 32. This entails a deflection of each secondary piezoelectric region 42 and of the underlying portion of supporting structure 32. In particular, the ends (with respect to a direction parallel to the axis x) of the secondary piezoelectric region 42, that are arranged, respectively, on the corresponding inner transverse element 38 and on the corresponding outer transverse element 39, tend to rise. In other words, each secondary piezoelectric region 42 and the underlying portion of supporting structure 32 bend in a plane parallel to the plane xz. Consequently, each secondary piezoelectric region 42 and the underlying portion of supporting structure 32, and consequently the second portion 34 of the supporting structure 32, tend to assume a U shape, as shown qualitatively in FIG. 8, with consequent variation of the stiffness of the first connection structure 22, as mentioned previously. In this connection, the presence of the inner transverse elements 38 and of the outer transverse elements 39 and the elongated shape of the secondary piezoelectric elements 42 enable variation of the stiffness of the corresponding connection structure in an efficient way, hence with low voltages. In particular, as mentioned previously, the stiffness of the first connection structure 22 in regard to deformations that cause oscillation of the mobile structure 12 about the axis $A_1$ is varied.

To a first approximation, the resonance frequency of each connection structure varies linearly as a function of the voltage applied to its own secondary piezoelectric regions.

This being said, imposing for example $V_{DC1}=V_{DC2}=V_{axis1} \neq V_{axis2}=V_{DC3}=V_{DC4}$, a deviation $\Delta f_r$ between the resonance frequencies $f_{r1}$ and $f_a$ of the MEMS reflector 8 is induced. Moreover, it may be shown that the MEMS reflector 8 enables precise control of deviations $\Delta f_r$ in the region of a few tens of hertz, even when the resonance frequencies $f_{r1}$ and $f_{r2}$ are in the region of 30 kHz.

Figure 9:
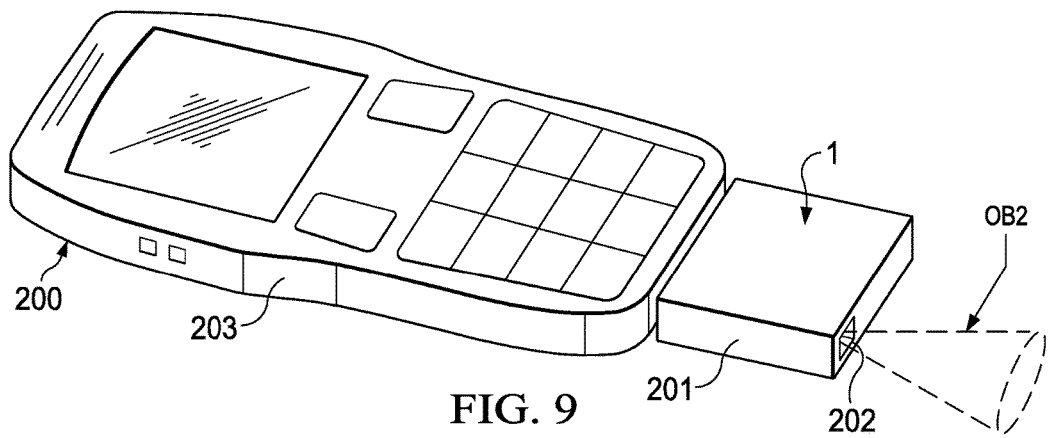
FIGS. 9 and 10 are schematic perspective views of portable apparatuses that incorporate the projective system.

As illustrated in FIG. 9, the MEMS projective system 1 may be provided as separate, stand-alone, accessory with respect to an associated portable electronic apparatus 200, such as, for example, a cellphone or smartphone (or else, for instance, a PDA, a tablet, a digital audio player, or a controller for videogames), being coupled to the portable electronic apparatus 200 itself by means of suitable electrical and mechanical connection elements (not illustrated in detail). In this case, the MEMS projective system 200 is provided with a case 201 of its own, which has at least one portion 202 transparent to the reflected optical beam OB2 generated by the MEMS reflector 8. The case 201 of the MEMS projective system 1 is coupled in a releasable way to a respective case 203 of the portable electronic apparatus 200.

Figure 10:
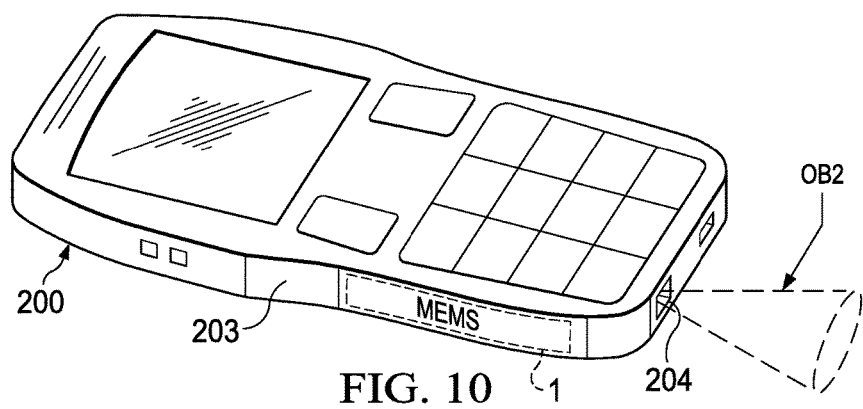

Alternatively, as illustrated in FIG. 10, the MEMS projective system 1 may be integrated within the portable electronic apparatus 200, being arranged in the case 203 of the portable electronic apparatus 200 itself, which has in this case a respective portion 204 transparent to the reflected optical beam OB2 generated by the MEMS reflector 8. In this case, the MEMS projective system 1 is, for example, coupled to a printed circuit present within the case 203 of the portable electronic apparatus 200.

From what has been described and illustrated previously, the advantages that this design affords emerge clearly.

In particular, thanks to the use of an elastic actuation system of a piezoelectric type, the present MEMS device enables implementation of an optical scan along two axes, with high scanning frequencies, which differ from one another by approximately 0.1%. This makes it possible to reduce the flicker phenomenon and to generate high-resolution images. Moreover, the difference in frequency can be modulated electrically in an extremely precise way.

In conclusion, it is clear that modifications and variations may be made to what has been described and illustrated herein, without thereby departing from the sphere of protection of the present invention, as defined in the annexed claims.

For example, the connection structures may have shapes and arrangement different from what has been described previously. For instance, within each connection structure, the number, shape, and arrangement of the main piezoelectric regions 40 and of the secondary piezoelectric regions 42 may be different from what has been described, as likewise the shape of the first and second portions 33, 34 of the supporting structure 32.

More in general, each connection structure may have a composition (understood as shape, number, and type of regions that form it) that is different from the one described. For example, it is possible for the supporting structure 32 to be made up of a different number of regions, or in any case of regions of a type different from the one described. For instance, the deformable semiconductor structure 70 may be absent and/or the shape and arrangement of the first and second metallizations 96, 110 and of the metal region 92 may be different from what has been described. Likewise, also the composition of the fixed structure 10 may be different from what has been described.

The number of the connection structures may be different from what has been described. For example, embodiments are possible that comprise just one connection structure for each actuation unit. For example, it is thus possible for there to be present only the first and second connection structures 22, 24. In addition, irrespective of the number of connection structures, it is possible for them to have a different mutual arrangement. For instance, embodiments (not shown) are possible that include three connection structures.

Finally, the actuation units may be actuated in a different way from what has been described. For example, with reference, without any loss of generality, to the embodiment shown in FIG. 1, it is, for example, possible to have $V_{AC3}=V_{AC4}=0$, in which case, the third and fourth connection structures 26, 28 are not actuated. In this case, it is moreover possible for the third and fourth connection structures 26, 28 to be without the respective main piezoelectric elements. Moreover, it is, for example, possible for the voltages (for example) $V_{AC1}$ and $V_{AC3}$ to be of a unipolar type and such that, when one of them assumes a positive value, the other assumes a zero or negative value.

Bending of the secondary piezoelectric elements 42 can be controlled indifferently with a positive or negative voltage, which can also cause an opposite curving with respect to what has been shown previously. Moreover, it is possible to have $V_{DC1} \neq V_{DC2}$ and/or $V_{DC3} \neq V_{DC4}$.

Finally, embodiments are possible in which the secondary elements 42 are arranged on a subset of the connection structures. For example, an embodiment is possible that includes only the first and second connection structures 22, 24, or in any case in which the third and fourth connection structures 26, 28 are without main piezoelectric elements (and possibly also without the secondary piezoelectric elements), and in which only one between the first and second connection structures 22, 24 comprises the secondary piezoelectric elements 42.

Figure 11:
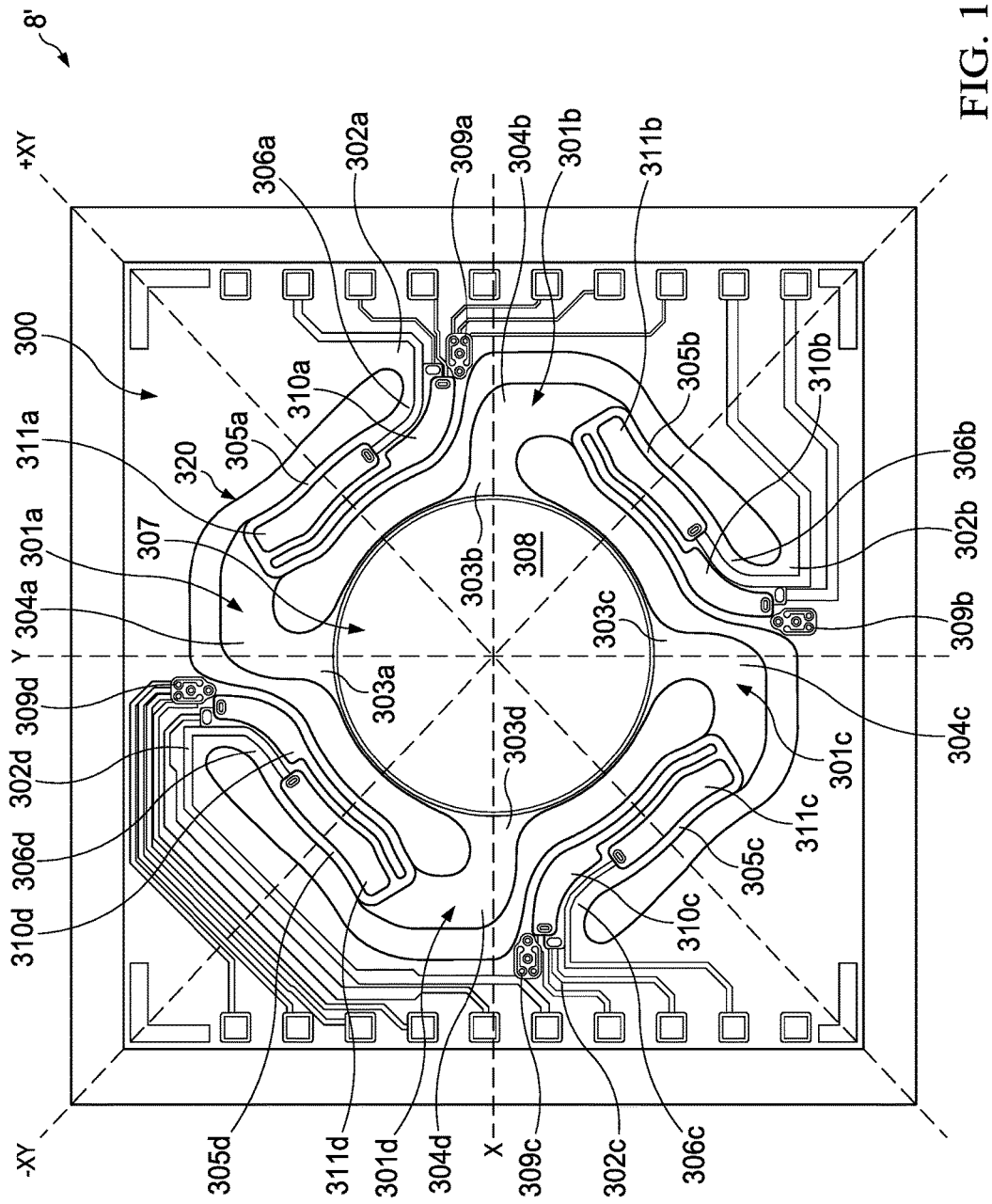
FIG. 11 is a top view of a different embodiment of a MEMS device.
Figure 12:
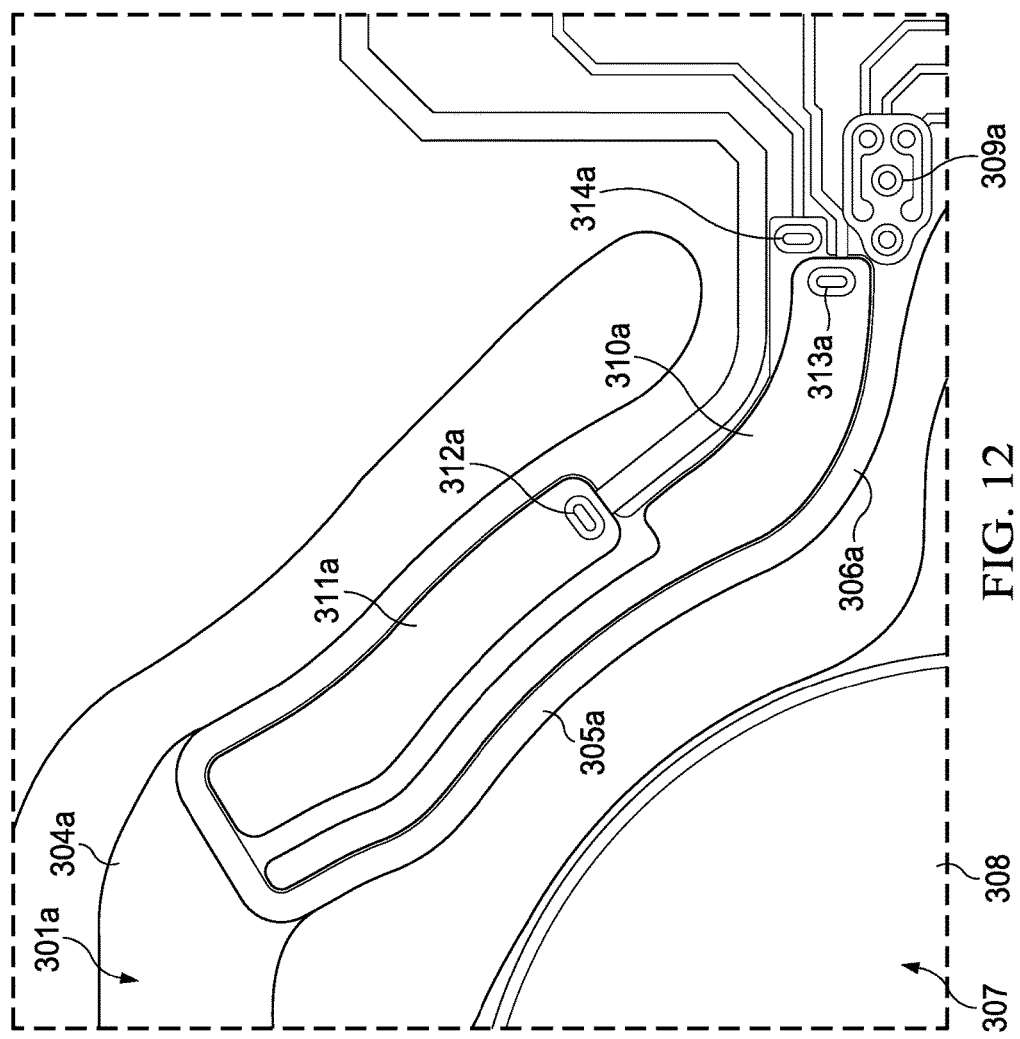
FIG. 12 is a greatly enlarged view of a portion of the MEMS device of FIG. 11.

Another design for a MEMS device 8' usable in the projective system of FIG. 1 is now described with initial reference to FIGS. 11-12. As will be explained below, this MEMS device 8' permits operation so as to reflect a laser into a Lissajous projection pattern while operating the MEMS device 8' in resonance biaxially.

The MEMS device 8' includes a fixed structure 300 having a cavity 320 formed therein. Suspended over the cavity 320 and surrounded by the fixed structure 300 at all points along its perimeter is a mobile structure 307 carrying a MEMS mirror 308. The mobile structure 307 and mirror 308 are circular in shape. First, second, third, and fourth deformable structures 301a-301d directly mechanically connect the mobile structure 307 to the fixed structure 300 to create the suspension over the cavity 320. In particular, the first, second, third, and fourth deformable structures 301a-301d respectively directly mechanically connect first, second, third, and fourth connection points 303a-303d along the perimeter of the mobile structure 307 to first, second, third, and fourth anchoring points 302a-302d along the top surfaces of the sidewalls of the cavity 320. The first, second, third, and fourth connection points 303a-303d are equally spaced about the perimeter of the mobile structure 307 at points 90 degrees apart from each other.

Note that the second and fourth anchoring points 302b, 302d are offset with respect to a first axis "Y" of the mobile structure 307 and are across a second axis "X" of the mobile structure 307 from one another. Also note that the first and third anchoring points 302a, 302c are offset with respect to the "X" axis and are across the "Y" axis from one another. In contrast, the first and third connection points 303a, 303c are aligned with the "Y" axis and are across the "X" axis from one another, and the second and fourth connection points 303b, 303d are aligned with the "X" axis and are across the "Y" axis from one another.

The first deformable structure 301a includes curved portion 304a directly mechanically connected to the connection point 303a, curved portion 306a directly mechanically connected to the anchoring point 302a, and an intermediate elongated portion 305a directly mechanically connected to the curved portions 304a, 306a. The curved portion 304a curves back toward the MEMS mirror 308 to follow the curve of the MEMS mirror 308. The intermediate elongated position 305a extends along the perimeter of the MEMS mirror 308, and itself alternatively curves toward the MEMS mirror 308 and away from the MEMS mirror 308 in a serpentine shape. The curved portion 306a curves away from the MEMS mirror 308. Piezoelectric elements 310a, 311a are directly mechanically connected to the first deformable structure 301a. The piezoelectric elements 310a, 311a both have lengths substantially greater than their widths, and the length of the piezoelectric element 310a is substantially greater than that of the piezoelectric element 311a. The piezoelectric elements 310a, 311a are spaced apart from one another, and their lengths run along the length of the first deformable structure 301a. It is to be noticed that there are only the two piezoelectric elements 310a, 311a mechanically coupled to the first deformable structure 301a, and that no other piezoelectric elements are mechanically coupled (or associated with) the first deformable structure 301a. The piezoelectric element 310a is actuated solely via application of a singular driving signal at a singular terminal 313a, referred to as a tuning terminal or electrode. The piezoelectric element 311a is actuated solely via application of a singular driving signal at a singular terminal 312a, referred to as an actuation terminal or electrode. Singular ground terminal 314a is common to both of the piezoelectric elements 310a, 311a. Piezoresistive sensor 309a is directly mechanically coupled to the first deformable structure 301a at the first anchoring point 302a and the curved portion 306a. By measuring the stress of the deformable structure 301a, it is possible to know the deflection angle of the mirror 308.

The second deformable structure 301b includes curved portion 304b directly mechanically connected to the connection point 303b, curved portion 306b directly mechanically connected to the anchoring point 302b, and an intermediate elongated portion 305b directly mechanically connected to the curved portions 304b, 306b. The curved portion 304b curves back toward the MEMS mirror 308 to follow the curve of the MEMS mirror 308. The intermediate elongated position 305b extends along the perimeter of the MEMS mirror 308, and itself alternatively curves toward the MEMS mirror 308 and away from the MEMS mirror 308 in a serpentine shape. The curved portion 306b curves away from the MEMS mirror 308. Piezoelectric elements 310b, 311b are directly mechanically connected to the second deformable structure 301b. The piezoelectric elements 310b, 311b both have lengths substantially greater than their widths, and the length of the piezoelectric element 310b is substantially greater than that of the piezoelectric element 311b. The piezoelectric elements 310b, 311b are spaced apart from one another, and their lengths run along the length of the second deformable structure 301b. It is to be noticed that there are only the two piezoelectric elements 310b, 311b mechanically coupled to the second deformable structure 301b, and that no other piezoelectric elements are mechanically coupled (or associated with) the second deformable structure 301b. The piezoelectric element 310b is actuated solely via application of a singular driving signal at a singular terminal 313b, referred to as a tuning terminal or electrode. The piezoelectric element 311b is actuated solely via application of a singular driving signal at a singular terminal 312b, referred to as an actuation terminal or electrode. Singular ground terminal 314b is common to both of the piezoelectric elements 310b, 311b. Piezoresistive sensor 309b is directly mechanically coupled to the second deformable structure 301b at the second anchoring point 302b and the curved portion 306b. By measuring the stress of the deformable structure 301b, it is possible to know the deflection angle of the mirror 308.

The third deformable structure 301c includes curved portion 304c directly mechanically connected to the connection point 303c, curved portion 306c directly mechanically connected to the anchoring point 302c, and an intermediate elongated portion 305c directly mechanically connected to the curved portions 304c, 306c. The curved portion 304c curves back toward the MEMS mirror 308 to follow the curve of the MEMS mirror 308. The intermediate elongated position 305c extends along the perimeter of the MEMS mirror 308, and itself alternatively curves toward the MEMS mirror 308 and away from the MEMS mirror 308 in a serpentine shape. The curved portion 306c curves away from the MEMS mirror 308. Piezoelectric elements 310c, 311c are directly mechanically connected to the third deformable structure 301c. The piezoelectric elements 310c, 311c both have lengths substantially greater than their widths, and the length of the piezoelectric element 310c is substantially greater than that of the piezoelectric element 311c. The piezoelectric elements 310c, 311c are spaced apart from one another, and their lengths run along the length of the third deformable structure 301c. It is to be noticed that there are only the two piezoelectric elements 310c, 311c mechanically coupled to the third deformable structure 301c, and that no other piezoelectric elements are mechanically coupled (or associated with) the third deformable structure 301c. The piezoelectric element 310c is actuated solely via application of a singular driving signal at a singular terminal 313c, referred to as a tuning terminal or electrode. The piezoelectric element 311c is actuated solely via application of a singular driving signal at a singular terminal 312c, referred to as an actuation terminal or electrode. Singular ground terminal 314c is common to both of the piezoelectric elements 310c, 311c. Piezoresistive sensor 309c is directly mechanically coupled to the third deformable structure 301c at the third anchoring point 302c and the curved portion 306c. By measuring the stress of the deformable structure 301c, it is possible to know the deflection angle of the mirror 308.

The fourth deformable structure 301d includes curved portion 304d directly mechanically connected to the connection point 303d, curved portion 306d directly mechanically connected to the anchoring point 302d, and an intermediate elongated portion 305d directly mechanically connected to the curved portions 304d, 306d. The curved portion 304d curves back toward the MEMS mirror 308 to follow the curve of the MEMS mirror 308. The intermediate elongated position 305d extends along the perimeter of the MEMS mirror 308, and itself alternatively curves toward the MEMS mirror 308 and away from the MEMS mirror 308 in a serpentine shape. The curved portion 306d curves away from the MEMS mirror 308. Piezoelectric elements 310d, 311d are directly mechanically connected to the fourth deformable structure 301d. The piezoelectric elements 310d, 311d both have lengths substantially greater than their widths, and the length of the piezoelectric element 310d is substantially greater than that of the piezoelectric element 311d. The piezoelectric elements 310d, 311d are spaced apart from one another, and their lengths run along the length of the fourth deformable structure 301d. It is to be noticed that there are only the two piezoelectric elements 310d, 311d mechanically coupled to the fourth deformable structure 301d, and that no other piezoelectric elements are mechanically coupled (or associated with) the fourth deformable structure 301d. The piezoelectric element 310d is actuated solely via application of a singular driving signal at a singular terminal 313d, referred to as a tuning terminal or electrode. The piezoelectric element 311d is actuated solely via application of a singular driving signal at a singular terminal 312d, referred to as an actuation terminal or electrode. Singular ground terminal 314d is common to both of the piezoelectric elements 310d, 311d. Piezoresistive sensor 309d is directly mechanically coupled to the fourth deformable structure 301d at the fourth anchoring point 302d and the curved portion 306d. By measuring the stress of the deformable structure 301d, it is possible to know the deflection angle of the mirror 308.

Figure 13:
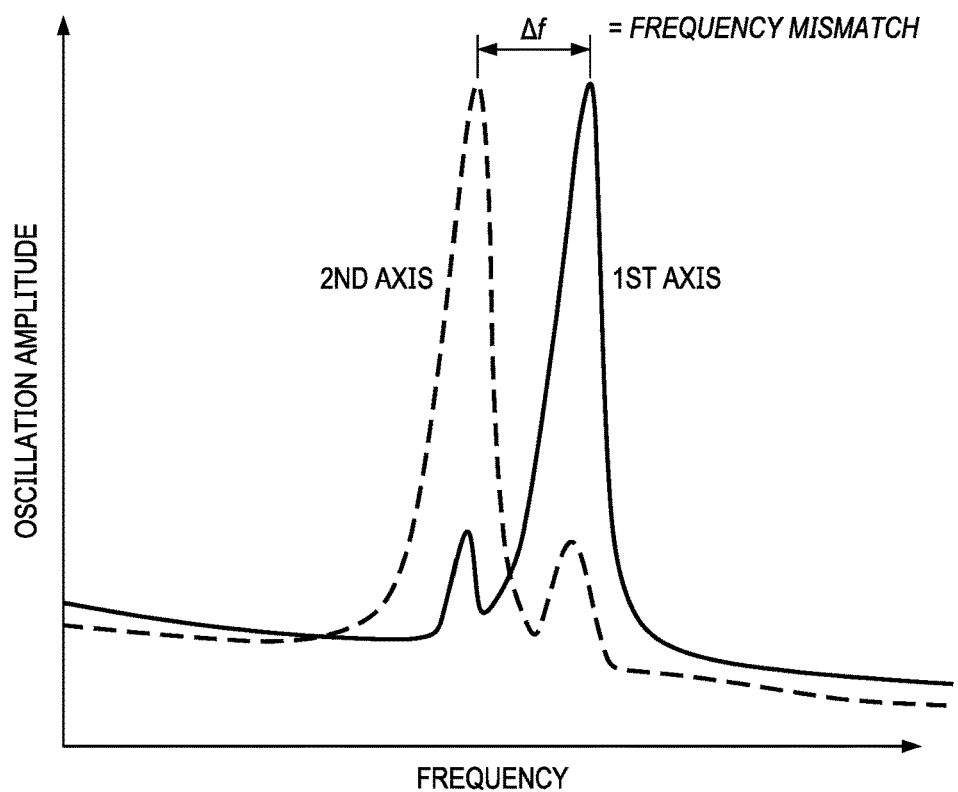
FIG. 13 is a chart of oscillation amplitude verses frequency of the MEMS device of FIG. 11 in operation.
Figure 14:
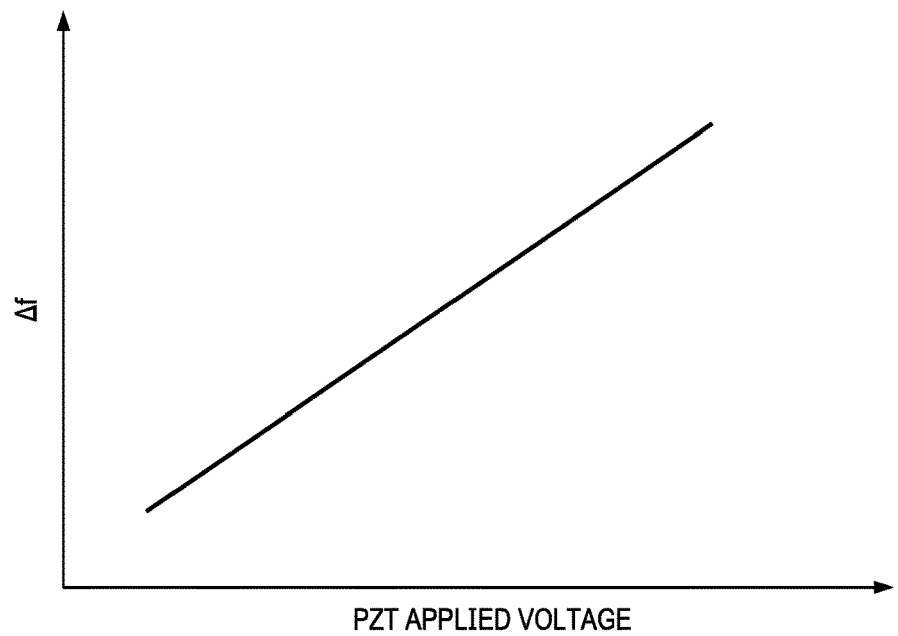
FIG. 14 is a chart of frequency verses applied voltage of the MEMS device of FIG. 11 in operation.
Figure 15:
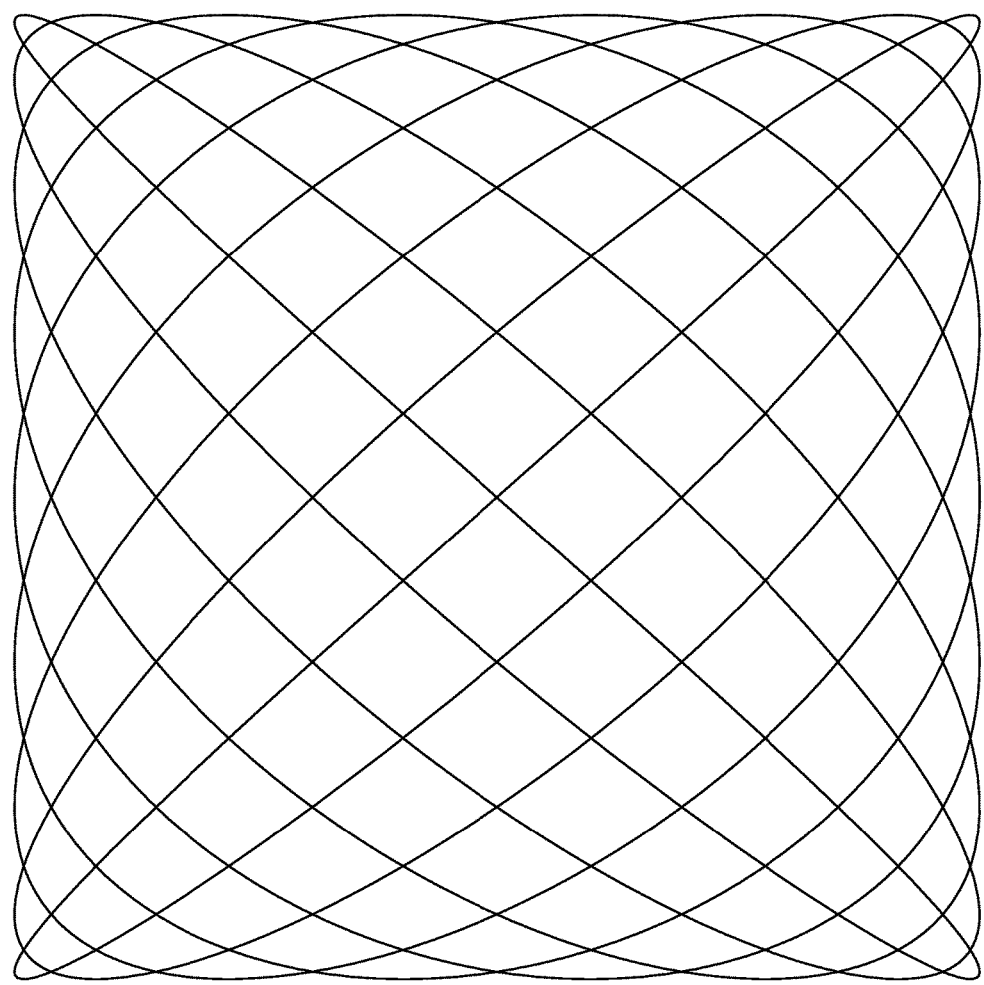
FIG. 15 is a diagram of a Lissajous scan pattern.

In operation, DC voltages or driving signals are applied to the tuning electrodes 313a-313d, while time varying voltages or driving signals are applied to the actuation electrodes 312a-312d, causing change in shape of the piezoelectric elements 310a-310d and 311a-311d. The time varying driving signals applied to actuation electrodes 312a and 312c have a same voltage amplitude and a same frequency, but are separated in phase by 180 degrees. Likewise, the time varying driving signals applied to the actuation electrodes 312b and 312d have a same voltage amplitude and a same frequency, but are separated in phase by 180 degrees. The frequency for the time varying signals applied to actuation electrodes 312a and 312c is set such that the mobile structure 307 oscillates at its resonance frequency about the "+XY" axis and the "−XY" axis. Likewise, the frequency for the time varying signals applied to the actuation electrodes 312b and 312d is set such that the mobile structure 307 oscillates at its resonance frequency about the "+XY" axis and the "−XY" axis. Note therefore that all piezoelectric elements participate in each mode of oscillation. The difference in frequency between +XY and −XY modes is set to be the desired refresh rate of the image produced by reflection of a modulated laser carrying pixel data by the mirror 308 in a scan pattern. This frequency mismatch is illustrated in FIG. 13, and can be adjusted by modulating the DC voltage applied to the tuning electrodes 313a, 313c and 313b, 313d. As can be seen in FIG. 14, the change in frequency mismatch scales linearly with the change in applied DC voltage. The effect of this driving scheme is such that the scan pattern produces a lissajous pattern, as shown in FIG. 15. The resonance frequency of the mobile structure 307 about the "+XY" axis may be on the order of 20-30 kHz, and the resonance frequency of the mobile structure 307 about the "−XY" axis may be on the order of 20-30 kHz, with a 60-120 Hz difference between the two when a voltage is applied on the tuning electrodes, since for the symmetry of the structure it is expected that the two modes have the same frequency when no voltage is applied to the tuning electrodes.

An advantage of this design for the MEMS device 8' is a greatly reduced number of piezoelectric elements and electrodes as compared to other designs. This simplifies routing of signals in a package containing the MEMS device 8', allowing for a more compact package as well as easier and less expensive manufacture. This also provides for a higher degree of mechanical robustness, which is commonly of concern in such electronic devices, as such electronic devices may be routinely subjected to external forces (e.g. being jostled via being carried in a briefcase, being dropped, etc). Moreover, the operation of the mobile structure 307 at resonance about both the "Y" axis and the "X" axis has the effect of reducing power consumption, which is also commonly of concern in electronic devices (such as picoprojectors) incorporating the MEMS device 8', as such devices are commonly powered by a battery.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A MEMS device, comprising:
a fixed structure having first, second, third, and fourth anchoring points;
a mobile structure surrounded by the fixed structure and having first, second, third, and fourth connection points;
wherein the second and fourth anchoring points are offset with respect to a first axis of the mobile structure and are across a second axis of the mobile structure from one another;
wherein the first and third anchoring points are offset with respect to the second axis and are across the first axis from one another;
wherein the first and third connection points are aligned with the first axis and are across the second axis from one another;
wherein the second and fourth connection points are aligned with the second axis and are across the first axis from one another;
a first deformable structure connecting the first anchoring point to the first connection point, the first deformable structure comprising a first curved portion connected to the first connection point, a first intermediate elongated portion having a proximal end coupled connected to the first curved portion, and a second curved portion connecting a distal end of the first intermediate elongated portion to the first anchoring point;
a second deformable structure connecting the second anchoring point to the second connection point, the second deformable structure comprising a third curved portion connected to the second connection point, a second intermediate elongated portion having a proximal end coupled connected to the third curved portion, and a fourth curved portion connecting to a distal end of the second intermediate elongated portion to the second anchoring point;
a third deformable structure connecting the third anchoring point to the third connection point, the third deformable structure comprising a fifth curved portion connected to the third connection point, a third intermediate elongated portion having a proximal end coupled connected to the fifth curved portion, and a sixth curved portion connecting a distal end of the third intermediate elongated portion to the third anchoring point; and
a fourth deformable structure connecting the fourth anchoring point to the fourth connection point, the fourth deformable structure comprising a seventh curved portion connected to the fourth connection point, a fourth intermediate elongated portion having a proximal end coupled connected to the seventh curved portion, and an eighth curved portion connecting a distal end of the fourth intermediate elongated portion to the fourth anchoring point;
wherein the first deformable structure includes first and second piezoelectric elements and no other piezoelectric elements;
wherein the second deformable structure includes third and fourth piezoelectric elements and no other piezoelectric elements;
wherein the third deformable structure includes fifth and sixth piezoelectric elements and no other piezoelectric elements; and
wherein the fourth deformable structure includes seventh and eighth piezoelectric elements and no other piezoelectric elements.

2. The MEMS device of claim 1, wherein the first piezoelectric element has a length and a width, the length of the first piezoelectric element being substantially greater than the width of the first piezoelectric element; wherein the second piezoelectric element has a length and a width, the length of the second piezoelectric element being substantially greater than the width of the second piezoelectric element; and wherein the second piezoelectric element runs adjacent to the first piezoelectric element along the length of the first piezoelectric element.

3. The MEMS device of claim 2, wherein the length of the second piezoelectric element is less than the length of the first piezoelectric element.

4. The MEMS device of claim 1, wherein the first piezoelectric element is actuated solely via application of a first singular driving signal at a first singular terminal, wherein the second piezoelectric element is actuated via application of a second singular driving signal at a second singular terminal, wherein the third piezoelectric element is actuated solely via application of a third singular driving signal at a third singular terminal, and wherein the fourth piezoelectric element is actuated via application of a fourth singular driving signal at a fourth singular terminal.

5. The MEMS device of claim 1, wherein the mobile structure is circular in shape; and wherein the first, second, third, and fourth connection points are 90 degrees apart from one another along the circular shape of the mobile structure.

6. The MEMS device of claim 1, wherein the second axis is perpendicular to the first axis.

7. The MEMS device of claim 1, wherein the first axis is an X axis and the second axis is a Y axis.

8. A MEMS device, comprising:
a fixed structure;
a mobile structure including a reflecting element;
a first deformable structure coupled between the fixed structure and the mobile structure; and
a second deformable structure coupled between the fixed structure and the mobile structure;
wherein the first deformable structure comprises:
a first elongated main body extending from the fixed structure to the mobile structure;
a first piezoelectric element mechanically coupled to the first elongated main body along a direction of elongation of the first elongated main body; and
a second piezoelectric element mechanically coupled to the first elongated main body along the direction of elongation of the first elongated main body, wherein the second piezoelectric element runs adjacent to the first piezoelectric element along the direction of elongation of the first elongated main body;
wherein the second deformable structure comprises:
a second elongated main body extending from the fixed structure to the mobile structure;
a third piezoelectric element mechanically coupled to the second elongated main body along a direction of elongation of the second elongated main body; and
a fourth piezoelectric element mechanically coupled to the second elongated main body along the direction of elongation of the second elongated main body, wherein the fourth piezoelectric element runs adjacent to the third piezoelectric element along the direction of elongation of the second elongated main body;

wherein the first and second piezoelectric elements of the first deformable structure are electrically controllable to cause a deformation of the first deformable structure along with an oscillation of the mobile structure about a first axis; and wherein the third and fourth piezoelectric elements of the second deformable structure are electrically controllable to cause a deformation of the second deformable structure along with an oscillation of the mobile structure about a second axis.

9. The MEMS device of claim 8, wherein the mobile structure has first and second connection points to which the first and second deformable structures are respectively coupled.

10. The MEMS device of claim 9, wherein the first connection point is centered about the first axis and the second connection point is centered about the second axis.

11. The MEMS device of claim 9, wherein the mobile structure is circular in shape; and wherein the first and second connection points are 90 degrees apart from one another along the circular shape of the mobile structure.

12. The MEMS device of claim 9, wherein the first deformable structure comprises a first curved portion connected to the first connection point, a first intermediate elongated portion having a proximal end coupled connected to the first curved portion, and a second curved portion connected to a distal end of the first intermediate elongated portion; wherein the fixed structure has a first anchoring point connected to the second curved portion; wherein the second deformable structure comprises a third curved portion connected to the second connection point, a second intermediate elongated portion having a proximal end coupled connected to the third curved portion, and a fourth curved portion connected to a distal end of the second intermediate elongated portion; and wherein the fixed structure has a second anchoring point connected to the fourth curved portion.

13. The MEMS device of claim 12, wherein the first intermediate elongated portion extends along a perimeter of the mobile structure between the first and second connection points; and wherein the second intermediate elongated portion extends along the perimeter of the mobile structure between the second and first connection points.

14. The MEMS device of claim 12, wherein the first anchoring point is offset with respect to the second axis; and wherein the second anchoring point is offset with respect to the first axis.

15. The MEMS device of claim 8, wherein the first piezoelectric element has a length and a width, the length of the first piezoelectric element being substantially greater than the width of the first piezoelectric element; wherein the second piezoelectric element has a length and a width, the length of the second piezoelectric element being substantially greater than the width of the second piezoelectric element; and wherein the second piezoelectric element runs adjacent to the first piezoelectric element along the length of the first piezoelectric element.

16. The MEMS device of claim 15, wherein the length of the second piezoelectric element is less than the length of the first piezoelectric element.

17. The MEMS device of claim 8, wherein the first deformable structure consists of the first elongated main body, first piezoelectric element, and second piezoelectric element; and wherein the second deformable structure consists of the second elongated main body, third piezoelectric element, and fourth piezoelectric element.

18. The MEMS device of claim 8, wherein the first deformable structure includes no piezoelectric elements other than the first and second piezoelectric elements; and wherein the second deformable structure includes no piezoelectric elements other than the third and fourth piezoelectric elements.

19. The MEMS device of claim 8, wherein the first piezoelectric element is actuated solely via application of a first singular driving signal at a first singular terminal, wherein the second piezoelectric element is actuated via application of a second singular driving signal at a second singular terminal, wherein the third piezoelectric element is actuated solely via application of a third singular driving signal at a third singular terminal, and wherein the fourth piezoelectric element is actuated solely via application of a fourth singular driving signal at a fourth singular terminal.

20. The MEMS device of claim 8, further comprising:
a third deformable structure coupled between the fixed structure and the mobile structure; and
a fourth deformable structure coupled between the fixed structure and the mobile structure;
wherein the third deformable structure comprises:
a third elongated main body;
a fifth piezoelectric element mechanically coupled to the third elongated main body along a direction of elongation of the third elongated main body; and
a sixth piezoelectric element mechanically coupled to the third elongated main body along the direction of elongation of the third elongated main body, wherein the sixth piezoelectric element runs adjacent to the fifth piezoelectric element along the direction of elongation of the third elongated main body;
wherein the fourth deformable structure comprises:
a fourth elongated main body;
a seventh piezoelectric element mechanically coupled to the fourth elongated main body along a direction of elongation of the fourth elongated main body; and
a eighth piezoelectric element mechanically coupled to the fourth elongated main body along the direction of elongation of the fourth elongated main body, wherein the eighth piezoelectric element runs adjacent to the seventh piezoelectric element along the direction of elongation of the fourth elongated main body;
wherein the fifth and sixth piezoelectric elements of the third deformable structure are electrically controllable to cause a deformation of the third deformable structure along with an oscillation of the mobile structure about the first axis; and
wherein the seventh and eighth piezoelectric elements of the fourth deformable structure are electrically controllable to cause a deformation of the fourth deformable structure along with an oscillation of the mobile structure about the second axis.

21. The MEMS device of claim 20, wherein the mobile structure has first and second connection points to which the first and second deformable structures are respectively coupled; and wherein the mobile structure has third and fourth connection points to which the third and fourth deformable structures are respectively coupled.

22. The MEMS device of claim 21, wherein the third connection point is across from and aligned with the first connection point; and wherein the fourth connection point is across from and aligned with the second connection point.

23. The MEMS device of claim 21, wherein the mobile structure is circular in shape; and wherein the first, second, third, and fourth connection points are 90 degrees apart from one another along the circular shape of the mobile structure.

24. The MEMS device of claim 21,
wherein the first deformable structure comprises a first curved portion connected to the first connection point, a first intermediate elongated portion having a proximal end coupled connected to the first curved portion, and a second curved portion connected to a distal end of the first intermediate elongated portion;
wherein the fixed structure has a first anchoring point connected to the second curved portion;
wherein the second deformable structure comprises a third curved portion connected to the second connection point, a second intermediate elongated portion having a proximal end coupled connected to the third curved portion, and a fourth curved portion connected to a distal end of the second intermediate elongated portion;
wherein the fixed structure has a second anchoring point connected to the fourth curved portion;
wherein the third deformable structure comprises a fifth curved portion connected to the third connection point, a third intermediate elongated portion having a proximal end coupled connected to the fifth curved portion, and a sixth curved portion connected to a distal end of the third intermediate elongated portion;
wherein the fixed structure has a third anchoring point connected to the sixth curved portion;
wherein the fourth deformable structure comprises a seventh curved portion connected to the fourth connection point, a fourth intermediate elongated portion having a proximal end coupled connected to the seventh curved portion, and an eighth curved portion connected to a distal end of the fourth intermediate elongated portion; and
wherein the fixed structure has a fourth anchoring point connected to the eighth curved portion.

25. The MEMS device of claim 24, wherein the first intermediate elongated portion extends along a perimeter of the mobile structure between the first and second connection points; wherein the second intermediate elongated portion extends along the perimeter of the mobile structure between the second and first connection points; wherein the third intermediate elongated portion extends along a perimeter of the mobile structure between the third and fourth connection points; and wherein the fourth intermediate elongated portion extends along the perimeter of the mobile structure between the fourth and third connection points.

* * * * *